(12) United States Patent
Chan et al.

(10) Patent No.: US 8,332,786 B1
(45) Date of Patent: Dec. 11, 2012

(54) HIGH LEVEL SYSTEM DESIGN USING FUNCTIONAL AND OBJECT-ORIENTED COMPOSITION

(75) Inventors: Chi Bun Chan, San Jose, CA (US); Jingzhao Ou, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 397 days.

(21) Appl. No.: 12/697,881

(22) Filed: Feb. 1, 2010

(51) Int. Cl.
   *G06F 17/50* (2006.01)
(52) U.S. Cl. .................. 716/104; 716/126; 716/132
(58) Field of Classification Search .................. 716/104, 716/126, 132
   See application file for complete search history.

(56) References Cited

U.S. PATENT DOCUMENTS

| | | | |
|---|---|---|---|
| 7,003,751 | B1 | 2/2006 | Stroomer et al. |
| 2006/0136570 | A1 * | 6/2006 | Pandya ........................ 709/217 |

OTHER PUBLICATIONS

U.S. Appl. No. 12/340,473, filed Dec. 19, 2008, Ma et al.
U.S. Appl. No. 12/622,327, filed Nov. 19, 2009, Szedo.
Bellows, Peter et al., "JHDL—An HDL for Reconfigurable Systems," *Proc. of the 6th Annual IEEE Symposium on Field-Programmable Custom Computing Machines (FCCM)*, Apr. 15, 1998, pp. 175-184, IEEE Computer Society, Washington, DC, USA.
Castells-Rufas, David et al., "Jumble: A Hardware-in-the-Loop Simulation System for JHDL," *Proc. of the 15th Annual IEEE Symposium on Field-Programmable Custom Computing Machines (FCCM)*, Apr. 23, 2007, pp. 345-348, IEEE Computer Society, Washington, DC, USA.
Haglund, Per et al., "Hardware Design with a Scripting Language," *Proc. of the 13th International Conference on Field-Programmable Logic and Applications (FPL)*, Sep. 1, 2003, pp. 1040-1043, Springer Publishing Company, New York, New York.
Ou, Jingzhao et al., "PyGen: A MATLAB/Simulink Based Tool for Synthesizing Parameterized and Energy Efficient Designs Using FPGAs," *Proc. of the 12th Annual IEEE Symposium on Field-Programmable Custom Computing Machines (FCCM)*, Apr. 23, 2004, pp. 47-56, IEEE Computer Society, Washington, DC, USA.

\* cited by examiner

*Primary Examiner* — Thuan Do
(74) *Attorney, Agent, or Firm* — Kevin T. Cuenot

(57) ABSTRACT

Within a high level modeling system (HLMS) comprising a processor and a memory, a method can include executing a system template comprising a plurality of modules of an electronic system, wherein each module represents a hardware component of the electronic system and is specified in the form of an extendable, higher order function, and extending, during runtime, a first module of the plurality of modules with a first extension by binding, via the processor, the first extension to the first module. The plurality of modules comprising the first extension to the first module can be stored within the memory.

20 Claims, 6 Drawing Sheets

145

215 {
```
channel MemoryChannel {
    parameter addrWidth
    parameter dataWidth
    port addr = Inport('addr', addrWidth)
    port dataIn = Inport('dataIn', dataWidth)
    port dataOut = Outport('dataOut', dataWidth)
}
```
}

205 {
```
module Processor {
    parameter addrBusWidth
    parameter dataBusWidth
    port clk = Inport('clk', 1)
    port rst = Inport('rst', 1)
    channel mainMemory = MemoryChannel('mainMemory')
    mainMemory.addrWidth = addrBusWidth
    mainMemory.dataWidth = dataBusWidth
}
```
}

210 {
```
module Memory {
    parameter size

// data bus width can be obtained through querying
    // the processor object of the parent system
    parameter dataWidth = parent.getInstanceOf(Processor).dataBusWidth
    port clk = Inport('clk', 1)
    channel iface = MemoryChannel('iface')
    iface.addrWidth = ceil(log2(size))
    iface.dataWidth = dataWidth
}
```
}

200 {
```
module System {
    port clk = Inport('clk', 1)
    port rst = Inport('rst', 1)

module p = Processor('Process')
    p.bind('clk' => clk, 'rst' =>rst)

module m = Memory('Memory')
    m.bind('clk' => clk, 'rst' => rst)

// find the memory interface of processor and main memory
    p.mainMemory.bind(m.iface)
```
}

405 {
```
module 8BitProcessor extends Processor {
    parameter dataBusWidth = 8
    parameter addressBusWidth = 8

// implementation of the 8-bit processor
}
```

410 { `module 8BitSystem = System('Processor' => 8BitProcessor)`

415 { `module 8BitSystemWithDDR2Memory = 8BitSystem('Memory' => DDR2Memory)`

250

```
            module L1Cache {
          ┌   reference mem = parent.getInstanceOf(Memory)
   605 ┤     reference proc = parent.getInstanceOf(Processor)
          │   reference memChannel = mem.getInstanceOf(MemoryChannel)
          └   reference proceMemChannel = proc.getInstanceOf(MemoryChannel)

parameter cacheSize channel memSide = MemoryChannel('memSide')
              memSide.addrWidth = memChannel.addrWidth
              memSide.dataWidth = memChannel.dataWidth channel procSide = MemoryChannel('procSide')
              procSide.addrWidth = procMemChannle.addrWidth
              procSide.dataWidth = procMemChannel.dataWidth 610 ┤{   memChannel.rebind(memSide)
              procMemChannel.rebind(procSide)

port clk = Inport('clk', 1)
              port rst = Inport('rst', 1)

clk.bind(parent.clk)
              rst.bind(parent.rst)
            } module SystemWithL1Cache = System('Cache' => L1Cache)
```

```
   705 ┤{ module AcceleratorCentricView extends System {
            hidden Processor, Memory
          }

// AcceleratorCentricView.getSubModules( ) returns only Accelerator modules

710 ┤{ module ProcessorCentricView extends System {
            hidden Accelerator
          }

// ProcessorCentricView.getSubModules( ) returns only Processor and Memory module
```

```
module ProtectedProcessor extends System {
    final Processor              // Processor cannot be extended or overwritten
    hidden EncryptionAccelerator // EncryptionAccelerator is not visible from
                                 // outside through querying the object interface
                                 // of ProtectedProcessor
```

HIGH LEVEL SYSTEM DESIGN USING FUNCTIONAL AND OBJECT-ORIENTED COMPOSITION

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The embodiments disclosed within this specification relate to integrated circuit devices (ICs). More particularly, the embodiments relate to designing systems for implementation within an IC using a high level modeling system.

BACKGROUND

A high level modeling system (HLMS) is a computer-based, circuit design tool that allows a user to create a circuit design at a high level of abstraction. An HLMS provides a design environment within which the user creates circuit designs using a modular approach. Typically, the HLMS provides a graphic design environment in which modules are inserted into the circuit design using a "drag-and-drop" design paradigm. The user can drag modules, represented as graphic blocks, into the design environment. Each module can represent a particular circuit function such as multiplexing, addition, multiplication, filtering, or the like. The user also can specify connectivity and signal flows within the circuit design by coupling exposed ports of modules by drawing lines, representing wires or signals, that couple the ports.

Typically, a hardware description language (HDL) such as VHDL or Verilog is used to describe the structural composition and behavioral properties of a module. An HLMS, for example, can utilize HDL to define the low level structural and behavioral properties of the various modules or blocks of the circuit being developed. HDLs, however, lack features that facilitate the creation of complex, modern system designs. For example, HDLs typically are not user-friendly and lack the flexibility needed to perform varied system development tasks.

SUMMARY

The embodiments disclosed within this specification relate to integrated circuit devices (ICs) and, more particularly, to designing systems for implementation within an IC using a high level modeling system (HLMS). One embodiment of the present invention can include a method implemented within an HLMS that comprises a processor and a memory. The method can include executing a system template comprising a plurality of modules of an electronic system, wherein each module represents a hardware component of the electronic system and is specified in the form of an extendable, higher order function. A first module of the plurality of modules can be extended during runtime with a first extension by binding, via the processor, the first extension to the first module. The plurality of modules comprising the first extension to the first module can be stored within the memory.

The method can include receiving the first extension in the form of an argument passed to the first module. The method further can include receiving a user input specifying at least one parameter of the first module and, responsive to receiving the user input, automatically generating the first extension that is bound to the first module. The first module can be recursively extended by passing at least a second extension as an argument to the first module and binding the at least a second extension to the first extension.

The method can include introspecting the system template and determining a parameter of a second module of the plurality of modules. Responsive to the introspecting, a parameter of the first module can be automatically set according to the parameter of the second module. In another aspect, a port interface of the electronic system can be dynamically modified during runtime of the system template.

The method further can include loading a new module into the HLMS, the new module introspecting the system template and determining at least one selected module of the plurality of modules to which the new module is to couple, and binding the new module to the at least one selected module determined through introspection.

In one aspect, at least one selected module of the plurality of modules can include a sub-module. In that case, an interface of the sub-module of the at least one selected module can be exposed as an interface of the electronic system. In another aspect, the method can include preventing extension, and/or introspection, of a selected module of the plurality of modules according to a security attribute of the selected module.

At least one selected module of the plurality of modules can be identified as a virtual module. Responsive to identifying the selected module, the selected module can be designated as a dynamically reconfigurable region supporting dynamic partial reconfiguration within a target IC.

Another embodiment of the present invention can include an HLMS for designing an electronic system. The HLMS can include a memory comprising program code and a processor coupled to the memory. The processor, executing the program code, can execute a system template comprising a plurality of modules of an electronic system, wherein each module represents a hardware component of the electronic system and is specified in the form of an extendable, higher order function. The processor can extend, during runtime of the system template, a first module of the plurality of modules with a first extension by binding the first extension to the first module. The processor further can store the plurality of modules comprising the first extension to the first module within the memory.

Within the HLMS, the processor can introspect the system template and determine a parameter of a second module of the plurality of modules. Responsive to the introspecting, the processor can automatically set a parameter of the first module according to the parameter of the second module.

In one aspect, the processor can dynamically modify a port interface of the electronic system during runtime of the system template. In another aspect, the processor can load a new module into the HLMS, cause the new module to introspect the system template and determine at least one selected module of the plurality of modules to which the new module is to couple, and bind the new module to the at least one selected module determined through introspection.

Another embodiment of the present invention can include a device comprising a data storage medium usable by a system comprising a processor and a memory, wherein the data storage medium stores program code that, when executed by the system, causes the system to execute operations. The operations can include executing a system template comprising a plurality of modules specifying an electronic system, wherein each module represents a hardware component of the electronic system and is specified in the form of an extendable, higher order function and extending, during runtime, a first module of the plurality of modules with a first extension by binding, via the processor, the first extension to the first module. The plurality of modules comprising the first extension to the first module can be stored within the memory.

The data storage medium further can store program code that, when executed by the system, causes the system to execute operations comprising introspecting the system template and determining a parameter of a second module of the plurality of modules. Responsive to the introspecting, the system can automatically set a parameter of the first module according to the parameter of the second module.

The data storage medium further can store program code that, when executed by the system, causes the system to execute an operation comprising dynamically modifying a port interface of the electronic system during runtime of the system template.

In one aspect, the data storage medium further can store program code that, when executed by the system, causes the system to execute operations comprising loading a new module into the HLMS, the new module introspecting the system template and determining at least one selected module of the plurality of modules to which the new module is to couple, and binding the new module to the at least one selected module determined through introspection.

In another aspect, at least one selected module of the plurality of modules can include a sub-module. Accordingly, the data storage medium further can store program code that, when executed by the system, causes the system to execute an operation comprising exposing an interface of the sub-module of the at least one selected module as an interface of the electronic system.

BRIEF DESCRIPTION OF THE DRAWINGS

FIG. 3 is first listing of program code illustrating a system template in accordance with another embodiment of the present invention.

FIG. 6 is a third listing of program code illustrating a module specifying the cache memory illustrated with respect to FIG. 5 in accordance with another embodiment of the present invention.

FIG. 7 is a fourth listing of program code illustrating the application of perspectives to a system template in accordance with another embodiment of the present invention.

DETAILED DESCRIPTION

While the specification concludes with claims defining the features of the embodiments of the invention that are regarded as novel, it is believed that the embodiments of the invention will be better understood from a consideration of the description in conjunction with the drawings. As required, detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the embodiments of the invention.

The embodiments disclosed within this specification relate to integrated circuit devices (ICs). More particularly, the embodiments relate to designing systems for implementation within an IC using a high level modeling system (HLMS). In accordance with the inventive arrangements disclosed herein, methods, systems, and apparatus for electronic system design are provided that support aspects of functional software design and object oriented software design. Modules that represent particular components of an electronic system can be specified in the form of objects and, more particularly, as extendable, higher-order functions. Adaptability and dynamic behavior of the modules can be facilitated through support for introspection of the electronic system by the constituent modules. Using these techniques, an electronic system can be specified at a generic level and then extended by continuously refining and/or customizing the underlying structure of the various modules of the electronic system.

Figure 1:
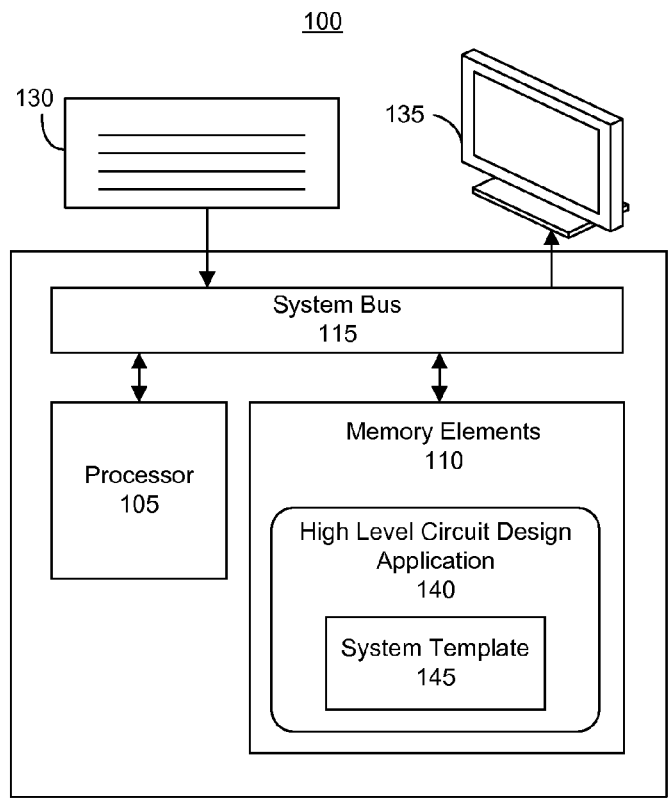
FIG. 1 is a first block diagram illustrating a high level modeling system for designing an electronic system in accordance with one embodiment of the present invention.

FIG. 1 is a first block diagram illustrating an HLMS 100 for designing an electronic system in accordance with one embodiment of the present invention. In one aspect, HLMS 100 can generate one or more circuit designs for instantiation within, or implementation as, an IC. The circuit designs that are generated can be instantiated within an IC, whether the IC is programmable or not.

Programmable ICs are a well-known type of IC that can be programmed to perform specified logic functions. Examples of programmable ICs can include, but are not limited to, field programmable gate arrays (FPGAs), complex programmable logic devices (CPLDs), and mask programmable devices. The phrase "programmable IC" can refer to the exemplary ICs noted herein and/or ICs that are only partially programmable. For example, another type of programmable IC includes a combination of hard-coded transistor logic and a programmable switch fabric that programmably interconnects the hard-coded transistor logic.

Some types of programmable ICs, such as FPGAs and CPLDs, are programmed by providing data bits to the device for the purpose of configuring the device. The programmable IC is configured, by loading the data bits, to implement or instantiate a particular electronic system or circuit specified by the data bits. The data bits provided to the programmable IC for the purpose of configuration also can be referred to as configuration data and, in some cases, a bitstream.

Turning again to FIG. 1, HLMS 100 can include at least one processor 105 coupled to memory elements 110 through a system bus 115. As such, HLMS 100 can store program code within memory elements 110. Processor 105 can execute the program code accessed from memory elements 110 via system bus 115. In one aspect, for example, HLMS 100 can be implemented as a computer that is suitable for storing and/or executing program code. It should be appreciated, however, that HLMS 100 can be implemented in the form of any system comprising a processor and memory that is capable of performing the functions described within this specification.

Memory elements 110 can include one or more physical memory devices such as, for example, local memory and one or more bulk storage devices. Local memory refers to random access memory or other non-persistent memory device(s) generally used during actual execution of the program code. Bulk storage device(s) can be implemented as a hard drive or other persistent data storage device. HLMS 100 also can include one or more cache memories that provide temporary storage of at least some program code in order to reduce the number of times program code is retrieved from the bulk storage device during execution.

Input/output (I/O) devices such as a keyboard 130, a display 135, and a pointing device (not shown) optionally can be coupled to HLMS 100. The I/O devices can be coupled to HLMS 100 either directly or through intervening I/O controllers. Network adapters also can be coupled to HLMS 100 to enable HLMS 100 to become coupled to other systems, computer systems, remote printers, and/or remote storage devices through intervening private or public networks. Modems, cable modems, and Ethernet cards are examples of different types of network adapters that can be used with HLMS 100.

As pictured in FIG. 1, memory elements 110 can store program code in the form of a high level circuit design application (design application) 140 and a system template 145. Design application 140, being implemented in the form of executable program code, can be executed by HLMS 100. Design application 140 can be used to specify an electronic system, such as a circuit design, at a high level of abstraction with increasing detail as will be described within this specification. Design application 140, when executed by processor 105, causes the HLMS 100 to perform the functions described within this specification.

Design application 140 can include system template 145. System template 145 can be a high level description of an electronic system that is being developed within HLMS 100. For example, system template 145 can be a high level architectural description of the electronic system being developed without specifying particular implementation details of the various components included within the electronic system. In one embodiment, system template 145 can be specified in the form of one or more modules. Each module can be specified in the form of a higher-order function. Accordingly, each module, being implemented as a higher-order function, can be extended in numerous ways. For example, a selected module can be passed one or more additional modules as arguments that further define the substructure of the selected module by extending the selected module. The extension process can be recursive as illustrated within this specification.

Figure 2:
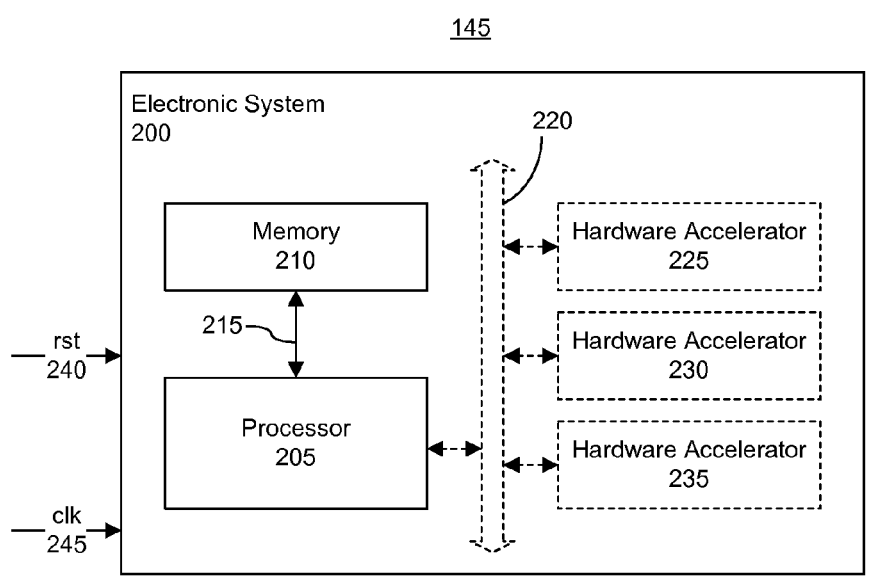
FIG. 2 is a second block diagram illustrating a pictorial view of an electronic system as specified by the system template of FIG. 1 in accordance with another embodiment of the present invention.

FIG. 2 is a second block diagram illustrating a pictorial view of an electronic system 200 as specified by system template 145 of FIG. 1 in accordance with another embodiment of the present invention. FIG. 2 illustrates the various modules that can be defined by system template 145. As shown, electronic system 200 includes a processor 205 coupled to a memory 210 through an interface 215. Electronic system 200 can receive a reset (rst) signal 240 and a clock (clk) signal 245. Optional components of electronic system 200, as illustrated with respect to FIG. 2, are indicated using dashed lines. Optional components can include a plurality of hardware accelerators 225, 230, and 235, each being coupled to processor 205 by a bus 220. In general, each component, e.g., processor 205, memory 210, and interface 215, is defined within electronic system 200 by a module that is implemented in the form of a higher-order function type of object. Working through HLMS 100, electronic system 200 can be further developed or defined by extending modules of system template 145.

As illustrated in the example pictured in FIG. 2, system template 145 can exist at a high level of abstraction and specify only that electronic system 200 includes a plurality of modules including processor 205, memory 210, and interface 215, each being coupled as shown. As such, system template 145 need not specify particular parameters of the components. For example, initially, system template 145 may not specify details such as the type of processor 205 or the width of interface 215 coupling processor 205 and memory 210. By extending each module, further substructure of processor 205, memory 210, and interface 215 can be defined.

As noted, dashed lines are used to illustrate optional components that are not explicitly defined within system template 145. Hardware accelerators 225-235 and system bus 220 can be added to electronic system 200 by extending one or more modules of system template 145. Thus, while system template 145 is amenable to specify bus 220 and hardware accelerators 225-235, system template 145 does not currently specify these modules. Rather, a plurality of modules can be added to system template 145 in the future utilizing the various techniques described within this specification to define bus 220 and hardware accelerators 225-235.

FIG. 3 is first listing of program code illustrating system template 145 in accordance with another embodiment of the present invention. Whereas FIG. 2 presented a component-oriented view of the electronic system 200 specified by system template 145, FIG. 3 illustrates example program code that can be used to implement system template 145. The program code listing of system template 145 is subdivided into a plurality of different modules that correspond to electronic system 200, processor 205, memory 210, and interface 215 as pictorially illustrated in FIG. 2. As such, the same reference numbers are used to refer to the components illustrated in FIG. 2 and the corresponding program code modules illustrated in FIG. 3, though the exact name may differ. In general, however, when referring to program code segments as opposed to the particular components specified by the program code segments, the term "module" is used. For example, processor 205 can be specified by processor module 205 of system template 145. Still, it should be appreciated that since a module specifies a component, the terminology referring to a component and the module defining that component may be used interchangeably within this specification from time to time.

In one embodiment, electronic system 200 can be initially specified as an incomplete template, e.g., system template 145, comprising one or more modules. Within system template 145, modules can be "concrete," "partial," or "virtual." A "concrete module" fully specifies the parameters necessary to translate that module into an HDL representation. In this sense, a concrete module is complete. Metrics that must be met in order for a module to be considered concrete can include each parameter having either a default value or being assigned a value and each port being well defined. For example, each port of a concrete module must have a well-defined width, data/signal type, and direction. In the case where a particular parameter of a module is to be implemented as parameterizable within the HDL representation, the module including that parameter can be considered concrete as long as the parameter to be parameterized has at least a default value.

Parameters to be implemented as parameterizable within an HDL representation can be indicated as such using any of a variety of different annotations (not shown) that are interpretable by the HLMS. Parameterizable HDL elements include elements, such as constants, that a user can specify or may be asked to specify or override within the HDL at the time the circuit design is to be instantiated within a target IC. For example, within VHDL, the "generic" construct can be used to specify parameterization. A default value can be specified within the entity declaration or through instantiation. Within Verilog, the "parameter" and the "defparam" constructs serve a similar purpose.

For a module to be considered concrete, each sub-module of that module also must be complete. This requirement, that each sub-module of a module be complete, applies recursively to all modules down the module hierarchy. Further, each sub-module of that module must be coupled to another sub-module so that no uncoupled sub-module exists within the concrete module. Regarding the coupling metric, each input port must be coupled to an element so that each input port has a driver driving that input port. The coupling metric, however, does not apply to an output port of a sub-module.

By comparison, a "partial module" can refer to a module that is not fully specified and therefore lacks necessary detail, e.g., parameters, for translating the module into an HDL representation. A partial module can be a module that does not meet one or more of the established metrics for a concrete module. The HLMS can query a user for missing parameter values to facilitate translation of the partial module into an HDL representation. When a user provides a value for a parameter in response to a query, or by extension as described herein, and the module meets the metrics described above for a concrete module, the partial module is then considered a concrete module. A "virtual module" can be an empty module that functions as a placeholder into which another module, whether virtual, partial, or concrete, can be inserted.

System template 145 specifies a module named "System," corresponding to electronic system 200. System module 200 includes "clk" as an input port and "rst" as an input port. Further, system module 200 comprises two sub-modules. The two sub-modules included within system module 200 are "p" and "m." For purposes of clarity, the term "module" is used to refer to a module whether or not that module is a sub-module of another module, a parent of another module, or a sibling of another module. The hierarchical relationship of one module to another in terms of system template 145 is indicated from time-to-time throughout this specification, but is not utilized each time a particular module is noted or described. For example, modules "p" and "m" are referred to as modules though each is actually a sub-module of system module 200. Module "p" is bound to "Processor," corresponding to processor module 205. Module "m" is bound to "Memory," corresponding to memory module 210. Each of the "m" and "p" modules further is bound to the "clk" and "rst" input ports. The last statement within system module 200 finds the memory interface of processor module 205, which is "Main-Memory," and the memory interface of main memory (e.g., memory module 210), which is "ifare," and binds the two, thereby establishing connectivity.

Interface 215 of FIG. 2 is represented as a channel called "MemoryChannel." Though denoted as a "channel," "MemoryChannel" is another variety of a module that couples together two or more other modules of system template 145. Since "MemoryChannel" can retain the properties of a higher-order function and object, as do each of modules 200, 205, and 210, the segment of program code specifying interface 215 is referred to as MemoryChannel module 215.

MemoryChannel module 215 specifies an abstract description of interface 215 in that MemoryChannel module 215 includes one or more ports and one or more parameters. MemoryChannel module 215 includes two unspecified parameters corresponding to the address width of the channel, denoted as "addrWidth," and the data width of the channel, denoted as "dataWidth." In this example, MemoryChannel module 215 is defined as a collection of ports including "addr," "dataIn," and "dataOut."

Processor module 205 specifies an abstract description of a processor component. Processor module 205 includes unspecified parameters corresponding to address bus width, denoted as "addrBusWidth," and data bus width, denoted as "dataBusWidth." Further, processor module 205 includes a clock port and a reset port that receive the "clk" and "rst" ports respectively that were defined within system module 200. Processor module 205 includes a channel called "mainMemory" that accesses a memory. The channel is set to reference MemoryChannel module 215. The address width and the data width of the "mainMemory" channel of processor module 205 are set to the parameters "addrBusWidth" and "dataBusWidth" respectively.

Memory module 210 specifies an abstract description of a memory component. As shown, memory module 210 includes a parameter called "size" that is unspecified. Memory module 210 also includes an input port corresponding to the "clk" port specified in system module 200. Memory module 210 includes an interface, referenced as "iface" having an address width denoted as "addrWidth" and a data width denoted as "dataWidth" that is determined as illustrated. "iface" is set equal to "iface" of MemoryChannel module 215.

Memory module 210 demonstrates adaptability of the embodiments described within this specification. As noted, each module can be implemented as a higher-order function and, in addition, be implemented as an object utilizing object-oriented design techniques. As such, each module provides an object interface that supports introspection by other modules of system template 145 within an HLMS configured as described within this specification. Functions such as querying and modifying the port interface of any module or sub-module of system template 145 can be performed utilizing the object interface of each respective module. Further, each module can be extended through inheritance and composition principles.

As known, inheritance refers to a technique for forming new modules using modules (e.g., classes) that have already been defined. Newly formed modules inherit attributes and behavior of the pre-existing modules. Object composition refers to the ability to combine simple objects into more complex objects. A composited, or composed, object, can be thought of as a complex object that contains one or more simple objects or objects of lesser complexity. For example, a complex processor module can include a simple port module. While the port module may have little or no significant functionality when considered independently, when the processor module is considered as a whole, the processor module will have functionality that is greater than the sum of the constituent modules.

Thus, a module, such as memory module 210, is an active entity that is able to interact with other modules of system template 145 through the object interface of each respective module. Accordingly, rather than passing parameters from a module to a sub-module thereof down the module hierarchy in a passive and static manner, a module can adapt to other modules. Moreover, as modules are further defined or extended, other modules can adapt to such extensions. A selected module can adapt to other modules whether the other modules are parent modules, sibling modules, or child modules of the selected module by querying the object interface of the relevant module(s). The parameters and/or parameter values determined through introspection can be used to assign values to parameters or establish relationships among parameters of different modules. Thus, adaptability of a module is not restricted to operating within the module hierarchy where a parent module passes an attribute to a child module. For example, the statement "parameter dataWidth=parent.getInstanceOf (Processor).dataBusWidth" locates processor module 205 and assigns the value of "dataBusWidth" of processor module 205 to the parameter "dataWidth" of memory module 210. In this example, since memory module 210 and processor module 205 are both sub-modules of system module 200, memory module 210 and processor module 205 are sibling modules.

Using introspection, one module can dynamically determine values of parameters in another module and utilize those values in setting parameters internal to the introspecting module. This allows a change to a data bus width, for example, to propagate more easily throughout an electronic system design. It should be appreciated that when the "getInstance" function returns more than one module, e.g., in this case more than one processor module, further logic can be included within the introspecting module to discriminate among the results to determine and/or select a particular instance of the processor module from which the value of "dataBusWidth" is obtained.

System template 145 of FIG. 3 illustrates a broad description of an electronic system where detailed implementations of each module are not specified. System template 145 provides an architecture, or framework, within which such infrastructure can be provided or inserted. As a working illustration, system template 145 can be developed by a system designer. Each module of system template 145, however, can be developed by a different designer or design group, as the case may be. As such, the group responsible for development of processor module 205 can begin defining modules that specify details of the infrastructure of processor 205 by extending processor module 205. Similarly, another design group can begin defining modules that specify details of the infrastructure of memory module 210 by extending memory module 210.

When system template 145 is loaded into memory within the HLMS, system template 145 is effectively executing. As such, system template 145, including the modules of system template 145, can be queried and introspected. For example, when loaded into memory within the HLMS, each respective module of system template 145 can be considered an active object. Apart from introspection described from one module to another, a user also can introspect aspects of system template 145. In that case, for example, the user need only enter instructions similar to, or the same as, those illustrated in FIG. 3 and throughout this specification into a command line or console interface where the instructions can be executed in real time with results being provided back to the user, e.g., displayed.

Figures 4, 5:
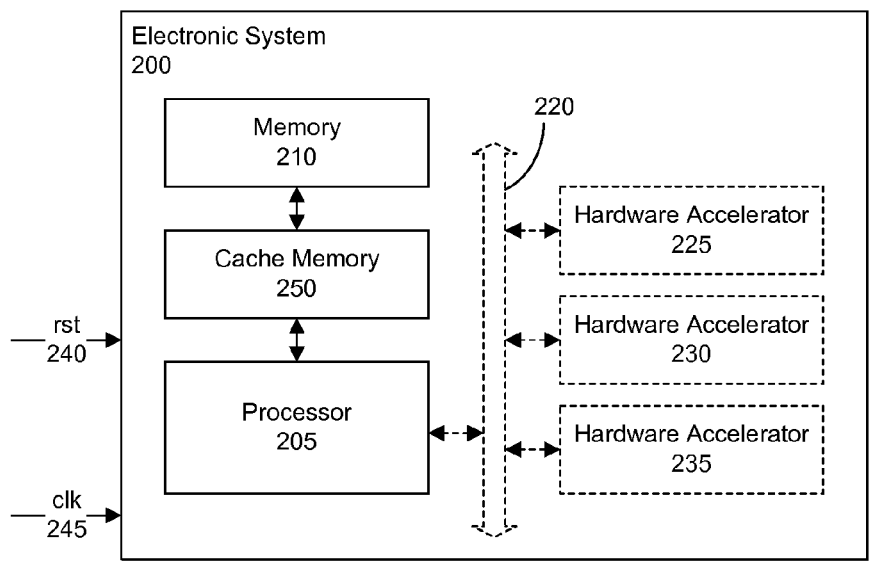
FIG. 4 is a second listing of program code illustrating an example of a second module extending a first module of a system template in accordance with another embodiment of the present invention.
FIG. 5 is a third block diagram illustrating the electronic system of FIG. 2 in accordance with another embodiment of the present invention.

FIG. 4 is a second listing 400 of program code illustrating an example of a second module extending a first module of the system template in accordance with another embodiment of the present invention. More particularly, listing 400 illustrates an example in which processor module 205 of FIG. 3, e.g., the first module, is further defined, e.g., extended, by a second module called "8 BitProcessor." 8 BitProcessor module 405 can be referred to as an extension in that 8 BitProcessor module 405 specifies additional implementation details of processor module 205. An "extension," as used herein, refers to a module that modifies the electronic system design in some way. For example, an extension can add new infrastructure or implementation details to the electronic system design or change infrastructure. In this sense, an extension can be said to "extend" the functionality of a particular module or modules. 8 BitProcessor module 405 defines the parameters "dataBusWidth" and "addressBusWidth" to be 8 bits each. By defining 8 BitProcessor module 405 as an extension of processor module 205, parameters "dataBusWidth" and "addressBusWidth" from processor module 205 are defined to be 8 bits through 8 BitProcessor module 405.

Listing 400 also defines two additional modules. The first is a module called "8 BitSystem." 8 BitSystem module 410 is defined as system module 200, albeit with processor module 205 being bound to 8 BitProcessor module 405. Thus, 8 BitSystem module 410 can be considered a version of system module 200, albeit with 8 BitProcessor module 405 bound to processor module 205. The second is a module called "8 BitSystemWithDDR2Memory." 8 BitSystemWithDDR2Memory module 415 is defined as 8 BitSystem module 410 with memory module 210 being bound to "DDR2Memory." Thus, 8 BitSystemWithDDR2Memory module 415 can be considered a version of module 410, albeit with DDR2Memory bound to memory module 210. Alternatively, 8 BitSystemWithDDR2Memory module 415 can be considered a version of system module 200, albeit with 8 BitProcessor module 405 bound to processor module 205 and 8 BitSystemWithDDR2Memory module 415 bound to memory module 210. For purposes of illustration, the module entitled "DDR2Memory" is not shown. A module implementation of "DDR2Memory" can be implemented similar to that of 8 BitProcessor module 405, e.g., as an extension, with the exception that the DDR2Memory module would extend memory module 210 to be a double data rate type of random access memory. Accordingly, the DDR2Memory module can provide further implementation details, e.g., infrastructure, to memory module 210.

Extending an existing module can be performed in a variety of different ways. In one embodiment, a user working within an HLMS as described with reference to FIG. 1 can provide one or more user inputs that simply specify the parameters "dataBusWidth" and "addressBusWidth" to be 8 bits. The user inputs can be received via a graphical user interface (GUI) of the HLMS or a command line. In that case, the HLMS can automatically generate the program code of listing 400 relating to processor module 205. More particularly, responsive to receiving specific values for parameters of processor module 205 from a user, the HLMS can automatically generate 8 BitProcessor module 405 and 8 BitSystem module 410. Once generated, the modules can be loaded into memory of the HLMS and become active modules that are part of system template 145. As active modules, when processor 205 is queried or introspected, for example, results from the queries will indicate the more detailed information relating to processor module 205 being an 8 bit processor corresponding to 8 BitProcessor module 405.

In another embodiment, a user that is tasked with developing processor module 205 can write or otherwise input the actual program code specified in listing 400. For example, the user can provide 8 BitProcessor module 405 and 8 BitSystem module 410 to the HLMS to extend processor module 205. A reference to a file including the program code can be passed to the HLMS via the command line, for example. Upon execution of that command line instruction, the indicated module or modules are loaded into memory of the HLMS, and thus executed, rendering each such module an active and executing module within the HLMS and part of system template 145.

Since each module is a higher-order function, 8 BitProcessor module 405 can be passed to processor module 205 in the form of an argument thereby extending processor module 205 to be an 8 bit processor. 8 BitSystem module 410 can be passed to system module 200 in the form of an argument thereby extending system module 200 to be an 8 bit system. The extension process can be performed recursively with each additional module, e.g., extension, that is passed providing further detail regarding the infrastructure of the electronic system defined by system template 145. Processor module 205 evolves from being a generic processor with a generic interface comprised of inputs and outputs. The inputs and outputs cannot be defined until such time that the type of the processor is defined. When a module defining the type of processor module 205, or other details, is passed as described and injected into processor module 205, the interface then can take a more specific form and move beyond a generic implementation.

The evolution of a module in this manner provides adaptability that goes beyond the capabilities of HDL programming. HDL, for example, requires a constant interface that cannot change. Thus, HDL cannot dynamically add or remove ports or be rebound to another module. HDL also lacks the ability to introspect other modules.

FIG. 5 is a third block diagram illustrating the electronic system 200 of FIG. 2 in accordance with another embodiment of the present invention. Like numbers are used to refer to the same items throughout this specification. As illustrated in FIG. 2, electronic system 200 does not include a cache memory 250. FIG. 5 illustrates the addition and inclusion of a cache memory 250 disposed between processor 205 and memory 210. Cache memory 250 can be inserted into electronic system 200 by creating or defining a module, e.g., an extension, corresponding to cache memory 250 that effectively inserts itself between processor 205 and memory 210. The newly defined and inserted cache module specifying cache memory 250 can, when executed, perform rebinding to specify connectivity within electronic system 200 as illustrated in FIG. 5.

FIG. 6 is a third listing of program code illustrating a module specifying cache memory 250 of FIG. 5 in accordance with another embodiment of the present invention. Execution of the program code listed in FIG. 6 inserts cache memory 250 within system template 145. More particularly, cache module 250 can be created that defines cache memory 250 and inserts cache memory 250 between processor 205 and memory 210 as illustrated with respect to FIG. 5.

Cache module 250 defines a module named "L1Cache." L1Cache is an extension of system module 200. Segment 605 of cache module 250 performs introspective functions such as locating instances of "Processor" corresponding to processor module 205 and "Memory" corresponding to memory module 210 from system template 145 to which cache module 250 is to bind. Segment 610 of cache module 250 replaces the existing binding between processor module 205 and memory module 210 to bind each of processor module 205 and memory module 210 to itself, e.g., cache module 250.

Thus, electronic system 200, which did not originally include a cache memory, can be modified to include cache memory 250 through addition of an extension. Cache module 250 can be passed system module 200 as an argument. Since system module 200 does not originally have a cache memory, L1Cache is added to system module 200 as a module, or sub-module as the case may be. Once cache module 250 is executed, introspecting processor module 205 and/or memory module 210 reveals connectivity with cache module 250 as illustrated in FIG. 5.

The example illustrated in FIG. 6 shows how hardware can be inserted into a circuit design through the inclusion of a module. Within the inserted module, the logic necessary for changing connectivity through rebinding, for example, is included. In this manner, other established modules, such as processor module 205 and memory module 210 do not require editing though cache memory is inserted between the two.

Implementation of modules in the form of higher-order functions facilitates late binding. In general, "binding" refers to the association of an object with a name or reference in the relevant programming language or code so that the object can be accessed using the name bound thereto. The phrase "late binding" refers to binding that occurs at run-time of the program code as opposed to "early binding" that occurs when program code is compiled. The late binding capability of modules facilitates the creation of highly parmeterizable intellectual property (IP) cores and systems on a chip designs. The modules, and thus systems created from the modules, are highly scalable. Utilizing late binding in conjunction with the object interface provided by each module allows the system design to adapt to unforeseen design changes. The interface of a module, the binding between two modules, or the composition within a module can be changed as demonstrated in FIG. 6 through addition of one or more extensions.

The figures discussed thus far have demonstrated the ability to extend existing modules of a system template and insert entirely new modules into a system template. It should be appreciated that the same techniques can be used to override previously specified parameters of modules. By passing a selected module another module, e.g., an extension, that specifies new values or parameters for previously defined or specified parameters, the previously specified parameters can be overridden with the newly specified parameters. The extension is incorporated into system template 145 and executed as part of system template 145.

FIG. 7 is a fourth listing 700 of program code illustrating the application of perspectives to a system template in accordance with another embodiment of the present invention. Listing 700 defines a plurality of perspectives that can be used to describe system template 145, and thus electronic system 200, from different viewpoints. Implementing modules as higher-order functions can be used for purposes other than parameterization of the modules. FIG. 7 illustrates a technique that utilizes the higher-order nature of the modules for purposes of presentation to developers or designers. Referring to FIG. 7, different perspectives can be defined that can be applied, or used, depending upon the particular development tasks being performed by users.

For example, module 705 of listing 700 specifies a first perspective called the "AcceleratorCentricView." Similarly, module 710 of listing 700 specifies a second perspective called the "ProcessorCentricView." In general, for each perspective, various attributes can be assigned to selected modules that, when interpreted by the HLMS, cause the HLMS to restrict access or functionality relating to the selected modules according to the particular perspective that is enforced. Perspectives can be applied on a per-user or per user-group basis.

The "AcceleratorCentricView" is an extension that modifies system template 145 by specifying a view in which both processor module 205 and memory module 210 of electronic system 200 are hidden from the user. When the "AcceleratorCentricView" is used or applied for a selected user within the HLMS, any introspective queries directed to the electronic system 200 return only accelerator modules, e.g., accelerator modules 225, 230, or 235. The existence of, and parameters for, processor module 205 and memory module 210 are simply ignored or otherwise hidden so that the user, for example, that is tasked with developing one or more of accelerator modules 225, 230, or 235, need not come in contact with, or be aware of, the existence of processor module 205 or memory module 210 when the "AcceleratorCentricView" is applied or executed by the HLMS.

The "AcceleratorCentricView" is presented as an example for purposes of illustration and is not intended as a limitation of the embodiments disclosed herein. Other variations are possible. For example, multiple accelerator centric views can be defined, where each view is targeted to a particular one of the hardware accelerators. Thus, a user assigned to work on accelerator module 225 need not be exposed to any detail, structure, or interface, of accelerator module 230 or accelerator module 235.

The "ProcessorCentricView" is an extension that modifies system template 145 by specifying a view in which each of accelerator modules 225, 230, and 235 is hidden. When the "ProcessorCentricView" is used or applied for a selected user within the HLMS, any introspective queries to electronic system 200 return only processor module 205 and memory module 210. The existence of, and parameters for, accelerator modules 225, 230, and 235 are simply ignored or otherwise hidden so that a user tasked with developing for the processor, e.g., software, need not come in contact with, or be aware of, the existence of any of the hardware accelerator modules 225, 230, or 235, or interfaces thereto, within electronic system 200. In this regard, a software developer can develop software for the processor unencumbered by technical details pertaining to other hardware that is hidden.

Using perspectives, what each user sees as being electronic system 200 and the modules, inclusive of the module interfaces, can be changed according to the user's role in designing or developing electronic system 200. The system architect, e.g., the user that created the original system template 145, can specify perspectives as needed. Perspectives within system template 145 can be applied by the HLMS when system template 145 is loaded, e.g., executed, according to the user's role or identity, for example. In another aspect, perspectives can be used in cases where IP is to be commercialized to third parties. In such cases, when electronic system 200 is sold as a hardware accelerator, the "AcceleratorCentricView" can be invoked for system template 145 so that no user may view or access functionality relating to processor module 205 or memory module 210. Similarly, when electronic system 200 is provided as a processor centric system, the "ProcessorCentricView" can be invoked for system template 145 so that no user may view or access functionality relating hardware accelerator modules 225-235. This ability can be coded into both system template 145 and the HLMS. Further, the user can be restricted from editing or viewing system template 145, or only be permitted to extend those modules that the user is permitted to view based upon the applicable perspective.

FIG. 7 illustrates a technique that can be used to change what a user is exposed to or sees when viewing a particular system. Rather than being presented with a top-down view in which the user sees the top level module, one or more modules within the top-level module can be the subject of a view so that the user is exposed only to the ports and/or interface(s) of the selected module or modules, e.g., sub-module(s), within the top-level module. FIG. 7 illustrates how the hierarchy of a system effectively can be changed using extensions for purposes of providing a developer with a particular representation or view of that system.

Figures 8, 9:
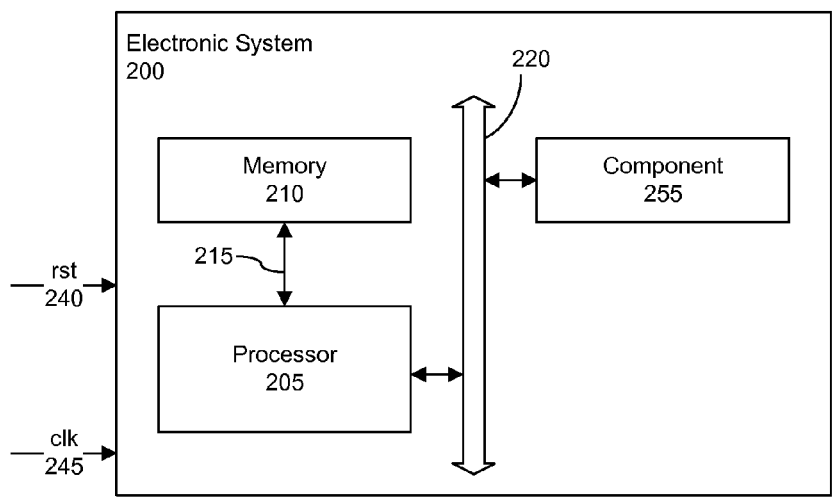
FIG. 8 is a fifth listing of program code illustrating an example of a module that implements intellectual property protection in accordance with another embodiment of the present invention.
FIG. 9 is a fourth block diagram illustrating use of late binding with respect to dynamic partial reconfiguration in accordance with another embodiment of the present invention.

FIG. 8 is a fifth listing 800 of program code illustrating an example of a module that implements IP protection in accordance with another embodiment of the present invention. More particularly, listing 800 defines an extension called "ProtectedProcessor" that extends system template 145 and, more particularly, processor module 205. The ProtectedProcessor module extends electronic system 200 to effectively lock processor module 205 and hide an accelerator module called "EncryptionAccelerator." The statement "final Processor" can lock processor module 205 and prevent any further modification of processor module 205 from extension modules that would otherwise overwrite or define further functionality. The statement "hidden EcryptionAccelerator" indicates that the accelerator module called "EncryptionAccelerator" is hidden. As such, the object interface of ProtectedProcessor cannot be queried to determine information about the module EncryptionAccelerator. When the module ProtectedProcessor is bound to processor module 205, queries directed to processor module 205 still can be carried out by the HLMS, though processor module 205 may not be modified.

FIG. 9 is a fourth block diagram illustrating use of late binding with respect to dynamic partial reconfiguration in accordance with another embodiment of the present invention. As pictured within FIG. 9, electronic system 200 includes a component 255. Component 255 can be specified by a virtual module. As such, no infrastructure is specified for component 255. Other components of electronic system 200 such as processor 205, memory 210, interface 215, and bus interface 220 can be specified by concrete modules. For purposes of illustration, the hardware accelerators have been omitted from the view of electronic system 200 pictured in FIG. 9.

FIG. 9 illustrates a technique for using late binding to abstract and indicate those regions of a system for which partial dynamic reconfiguration is used when implemented within a programmable IC. More particularly, components specified by virtual modules, in this case component 255, when processed by the HLMS for implementation within a target programmable IC, can be designated as a dynamically reconfigurable region of electronic system 200 and the programmable IC within which electronic system 200 is to be instantiated. During the process steps for implementing electronic system 200 within the target programmable IC, e.g., during mapping, placing, routing, etc., the HLMS or other circuit design tool, can guide the process flow as needed. For example, placement and routing constraints can be automatically added so that the virtual module is implemented as a dynamically reconfigurable region in the target programmable IC, while concrete modules are not.

Subsequently, after identifying a virtual module as a placeholder for a dynamically reconfigurable region, a concrete module can be passed to the virtual module as an argument.

The module being passed can be processed and translated into configuration data for programming only the dynamically reconfigurable region of the target programmable IC to be occupied by the virtual module. For example, the virtual module, having been passed a concrete module, can be translated into a partial bitstream. A similar process can be performed for each different variation of the virtual module to be used during dynamic reconfiguration of the region.

In illustration, the HLMS, utilizing the processes described within this specification, can generate a bitstream that leaves a portion of the target programmable IC corresponding to component 255 available for partial dynamic reconfiguration. When component 255 is specified using one or more concrete modules, each concrete module can be processed to generate configuration data specifying, for example, a partial bitstream. Each partial bitstream only implements a particular hardware circuit within the region of the target programmable IC reserved for dynamic partial reconfiguration. In this case, each partial bitstream corresponds to a different concrete implementation of component 255.

As described, virtual modules can be left undefined within an HLMS as described within this specification and, as such, designated as dynamically reconfigurable modules by the HLMS. In another embodiment, however, the HLMS can supply a default implementation for a virtual module. In that case, the HLMS may or may not designate the virtual module as a dynamically reconfigurable module. For example, the default implementation can be used as one potential configuration of a plurality of such configurations yet to be defined. Alternatively, the default configuration can be used and the virtual module need not be designated as a dynamically reconfigurable module.

Figure 10:
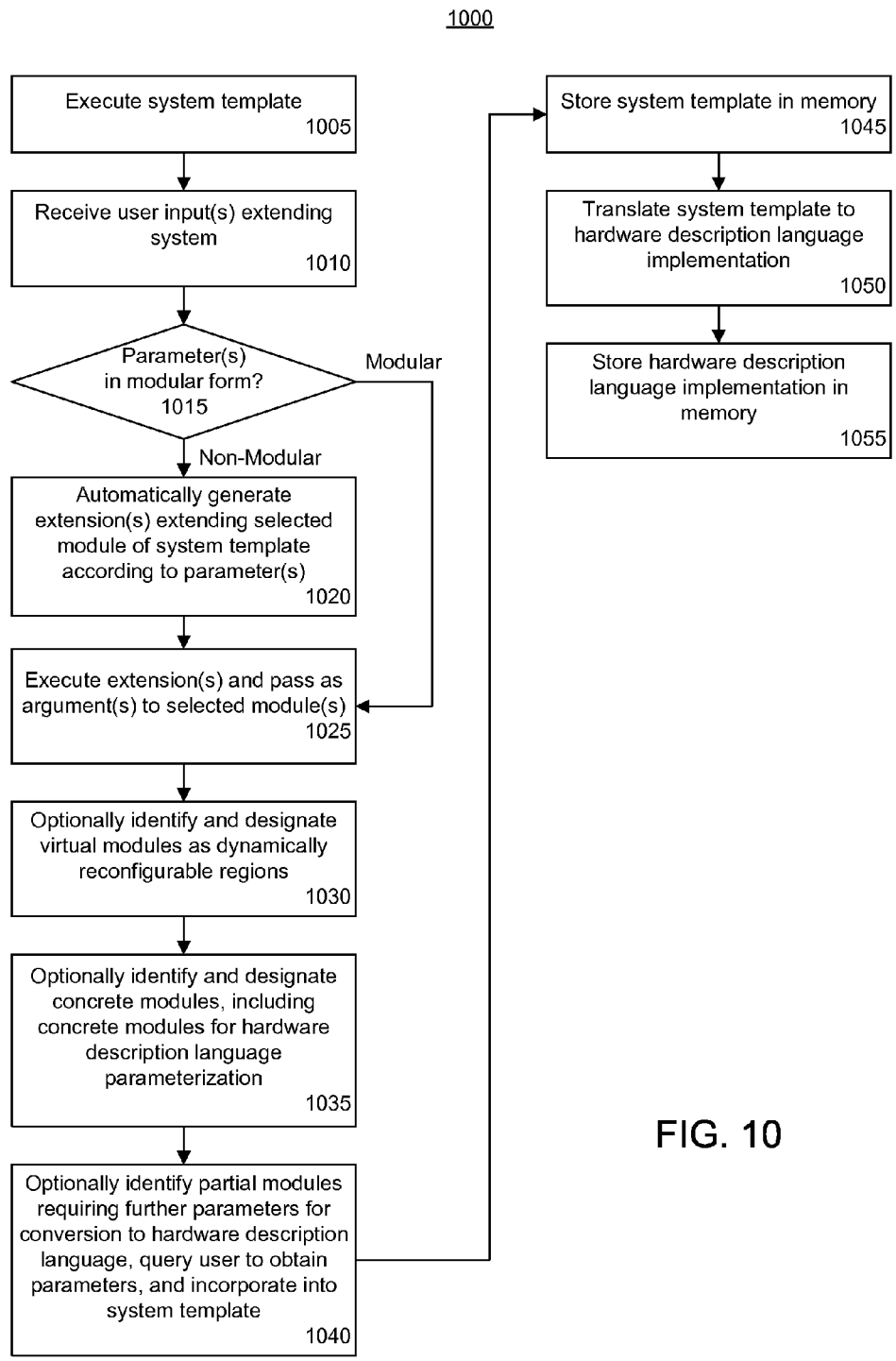
FIG. 10 is a flow chart illustrating a method of designing an electronic system in accordance with another embodiment of the present invention.

FIG. 10 is a flow chart illustrating a method 1000 of designing an electronic system in accordance with another embodiment of the present invention. Method 1000 can be performed by a system as described with reference to FIGS. 1-9. Accordingly, method 1000 can begin in step 1005, where a system template can be executed by the HLMS, thereby loading each module of the system template into memory of the HLMS and rendering that module an active object. As noted, modules can be specified as virtual modules, partial modules, or as concrete modules.

In step 1010, one or more user inputs that extend the system specified by the system template can be received by the HLMS. In step 1015, the HLMS can determine whether the user input specified one or more parameters in modular form. For example, parameters specified in non-modular form can be received through a command line or via a GUI of the HLMS to be assigned to a selected module of the electronic system to be extended. Parameters specified in modular form can be provided to the HLMS in the form of a module, e.g., an extension, that can be passed as an argument and incorporated within the system template.

When the parameter is provided to the HLMS in non-modular form, method 1000 can continue to step 1020. In step 1020, the HLMS can automatically generate a module, e.g., a first extension, that incorporates the received parameter(s) and that extends the selected module of the electronic system. As illustrated, the HLMS can also automatically generate a second extension that redefines the system in terms of the module being extended and the extension. It should be appreciated that the module being extended also can be the system module in that a newly specified module can be defined and inserted into the system template as described. The extension(s) further can override existing module parameter values in lieu of providing further detail or infrastructure to an existing module.

Proceeding to step 1025, the extension(s) can be executed, e.g., loaded into memory of the HLMS, thereby becoming active objects. The extension(s), whether automatically generated by the HLMS or provided to the HLMS by a user, can be passed as an argument, or arguments, to the higher-order function, e.g., the selected module of the electronic system. Accordingly, introspection and binding operations specified by the extension(s) can be performed. The results of any queries can be incorporated into the binding operations as specified within each respective module of the system template. Thus, at runtime, through execution of the system template, various actions can be taken such as dynamically changing connectivity of modules through rebinding or dynamically modifying a port interface of the electronic system. As noted, an extension can add structure or override existing structure of a module. An extension further can add a new module (component) to the electronic system.

It should be appreciated that while steps 1010, 1015, 1020, and 1025 are shown as being repeated one time, steps 1010-1025 can be repeated as may be required to continue to receive further user input that extends the electronic system. Steps 1010-1025, for example, can be iterated each time that one or more parameters is received for a selected module of the electronic system. At some point during the development process, when development of the electronic system has completed, for example, method 1000 can proceed to step 1030.

In step 1030, virtual modules of the system template optionally can be identified and designated, e.g., selected, as dynamically reconfigurable modules of the electronic system. In step 1035, concrete modules of the system template optionally can be identified and designated as such. Concrete modules including one or more parameters designated for parameterization within the HDL representation also can be identified.

In step 1040, any partial modules requiring further parameters for conversion into HDL optionally can be identified. The HLMS can query the user to obtain the necessary parameter values for conversion of the partial modules into HDL representations. The obtained parameter values can be incorporated into the system template, whether by overwriting existing parameters or by automatically generating modules as extensions that incorporate the user-specified parameters by extending existing modules of the system template. The query process of step 1040 can, in general, transform a partial module into a concrete module.

In step 1045, the system template can be stored within memory of the HLMS. In step 1050, the system template can be translated into an HDL representation. Concrete modules can be translated into HDL representations. The HLMS can treat virtual modules as dynamically reconfigurable regions of the programmable IC. Accordingly, the necessary location constraints and routing constraints can be applied to maintain the dynamically reconfigurable region. Any subsequent extending of the module(s) designated as dynamically reconfigurable can be processed to generate configuration data that instantiates circuitry only within the dynamically reconfigurable region.

In step 1055, the HDL representation of the electronic system can be stored within memory. At some point after HDL generation, the description of the electronic system can be further processed to generate the necessary configuration data that can be loaded into the programmable IC to instantiate the electronic system.

FIG. 10 illustrates a generalized methodology for creating an electronic system utilizing modules specified in the form of higher-order functions. It should be appreciated that the system template can be stored within memory so that future changes to the electronic system can be more easily implemented through further extensions utilizing the higher-order functions as opposed to implementing changes to the electronic system in HDL or another less user friendly and extendable system description language.

In one aspect, the program code examples can represent interpretive program code that does not require compilation prior to execution within the HLMS. In another embodiment, the program code examples can be compiled into another format such as byte code or another intermediate form that can be executed or interpreted by the HLMS. In still another embodiment, the program code examples can be compiled into an executable format, e.g., a binary format for execution within the HLMS.

The flowchart in the figures illustrates the architecture, functionality, and operation of possible implementations of systems, methods and computer program products according to various embodiments of the present invention. In this regard, each block in the flowchart may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and executable instructions.

Embodiments of the present invention can be realized in hardware or a combination of hardware and software. The embodiments can be realized in a centralized fashion in one system or in a distributed fashion where different elements are spread across several interconnected systems. Any kind of data processing system or other apparatus adapted for carrying out the methods described herein is suited.

Embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A method, comprising:
   executing, within a high level modeling system (HLMS) comprising a processor and a memory, a system template specifying a high level architectural description of an electronic system comprising a plurality of modules, wherein each module represents a hardware component of the electronic system and is specified as an extendable, higher order function;
   extending, during runtime of the system template, a first module of the plurality of modules with a first extension specifying an implementation parameter for the first module not originally specified by the first module by binding, via the processor, the first extension to the first module; and
   storing the plurality of modules comprising the first extension to the first module within the memory.

2. The method of claim 1, further comprising receiving the first extension in the form of an argument passed to the first module.

3. The method of claim 1, further comprising:
   receiving a user input specifying the implementation parameter of the first module; and
   responsive to receiving the user input, automatically generating the first extension that is bound to the first module.

4. The method of claim 1, further comprising recursively extending the first module by passing at least a second extension as an argument to the first module and binding the at least a second extension to the first extension.

5. The method of claim 1, further comprising:
   introspecting the system template and determining a parameter of a second module of the plurality of modules; and
   responsive to the introspecting, automatically setting a parameter of the first module according to the parameter of the second module.

6. The method of claim 1, further comprising dynamically modifying a port interface of the electronic system during runtime of the system template.

7. The method of claim 1, further comprising:
   loading a new module into the HLMS;
   the new module introspecting the system template and determining at least one selected module of the plurality of modules to which the new module is to couple; and
   binding the new module to the at least one selected module determined through introspection.

8. The method of claim 1, wherein at least one selected module of the plurality of modules comprises a sub-module, the method further comprising:
 exposing an interface of the sub-module of the at least one selected module as an interface of the electronic system.

9. The method of claim 1, further comprising preventing extension of a selected module of the plurality of modules according to a security attribute of the selected module.

10. The method of claim 1, further comprising preventing introspection of a selected module of the plurality of modules according to a security attribute of the selected module.

11. The method of claim 1, further comprising:
 automatically identifying a selected module of the plurality of modules as a virtual module; and
 responsive to identifying the selected module, designating the selected module as a dynamically reconfigurable region.

12. A high level modeling system (HLMS) for designing an electronic system, the HLMS comprising:
 a memory comprising program code; and
 a processor coupled to the memory and executing the program code, wherein the processor:
 executes a system template specifying a high level architectural description of an electronic system comprising a plurality of modules, wherein each module represents a hardware component of the electronic system and is specified as an extendable, higher order function;
 extends, during runtime of the system template, a first module of the plurality of modules with a first extension specifying an implementation parameter for the first module not originally specified for the first module by binding the first extension to the first module; and
 stores the plurality of modules comprising the first extension to the first module within the memory.

13. The HLMS of claim 12, wherein the processor:
 introspects the system template and determines a parameter of a second module of the plurality of modules; and
 responsive to the introspecting, automatically sets a parameter of the first module according to the parameter of the second module.

14. The HLMS of claim 12, wherein the processor dynamically modifies a port interface of the electronic system during runtime of the system template.

15. The HLMS of claim 12, wherein the processor:
 loads a new module into the HLMS;
 causes the new module to introspect the system template and determine at least one selected module of the plurality of modules to which the new module is to couple; and
 binds the new module to the at least one selected module determined through introspection.

16. A device, comprising:
 a data storage medium usable by a high level modeling system comprising a processor and a memory, wherein the data storage medium stores program code that, when executed by the system, causes the system to execute operations comprising:
 executing a system template specifying a high level architectural description of an electronic system comprising a plurality of modules, wherein each module represents a hardware component of the electronic system and is specified as an extendable, higher order function;
 extending, during runtime of the system template, a first module of the plurality of modules with a first extension specifying an implementation parameter for the first module not originally specified by the first module by binding, via the processor, the first extension to the first module; and
 storing the plurality of modules comprising the first extension to the first module within the memory.

17. The device of claim 16, wherein the data storage medium further stores program code that, when executed by the system, causes the system to execute operations comprising:
 introspecting the system template and determining a parameter of a second module of the plurality of modules; and
 responsive to the introspecting, automatically setting a parameter of the first module according to the parameter of the second module.

18. The device of claim 16, wherein the data storage medium further stores program code that, when executed by the system, causes the system to execute an operation comprising:
 dynamically modifying a port interface of the electronic system during runtime of the system template.

19. The device of claim 16, wherein the data storage medium further stores program code that, when executed by the system, causes the system to execute operations comprising:
 loading a new module into the memory;
 the new module introspecting the system template and determining at least one selected module of the plurality of modules to which the new module is to couple; and
 binding the new module to the at least one selected module determined through introspection.

20. The device of claim 16, wherein at least one selected module of the plurality of modules comprises a sub-module, wherein the data storage medium further stores program code that, when executed by the system, causes the system to execute an operation comprising:
 exposing an interface of the sub-module of the at least one selected module as an interface of the electronic system.

* * * * *